US011975556B2

(12) United States Patent
Yoshimoto et al.

(10) Patent No.: US 11,975,556 B2
(45) Date of Patent: May 7, 2024

(54) WATER-DEVELOPABLE FLEXOGRAPHIC PRINTING ORIGINAL PLATE

(71) Applicant: TOYOBO CO., LTD., Osaka (JP)

(72) Inventors: Kazuya Yoshimoto, Okayama (JP); Jun Hasuike, Okayama (JP)

(73) Assignee: TOYOBO MC CORPORATION, Osaka (JP)

( * ) Notice: Subject to any disclaimer, the term of this patent is extended or adjusted under 35 U.S.C. 154(b) by 523 days.

(21) Appl. No.: 17/278,872

(22) PCT Filed: Sep. 17, 2019

(86) PCT No.: PCT/JP2019/036366
§ 371 (c)(1),
(2) Date: Mar. 23, 2021

(87) PCT Pub. No.: WO2020/105259
PCT Pub. Date: May 28, 2020

(65) Prior Publication Data
US 2022/0048307 A1 Feb. 17, 2022

(30) Foreign Application Priority Data
Nov. 21, 2018 (JP) ................................. 2018-217898

(51) Int. Cl.
*B41N 1/12* (2006.01)
*G03F 7/033* (2006.01)
*G03F 7/075* (2006.01)
*G03F 7/095* (2006.01)

(52) U.S. Cl.
CPC ............... *B41N 1/12* (2013.01); *G03F 7/033* (2013.01); *G03F 7/0757* (2013.01); *G03F 7/095* (2013.01)

(58) Field of Classification Search
CPC .......... G03F 7/033; G03F 7/095; G03F 7/027; G03F 7/0755; G03F 7/075; B41N 1/12; B05D 2518/10; B05D 5/04; B41M 5/52
See application file for complete search history.

(56) References Cited

U.S. PATENT DOCUMENTS

| | | | | |
|---|---|---|---|---|
| 4,517,279 A * | 5/1985 | Worns | ................ | G03F 7/033 430/286.1 |
| 6,326,126 B1 * | 12/2001 | Gries | ................ | G03F 7/033 430/286.1 |
| 6,344,303 B1 * | 2/2002 | Takahashi | ................ | G03F 1/68 430/258 |
| 6,485,812 B1 * | 11/2002 | Sekiguchi | ............ | B41M 5/5227 428/323 |
| 7,901,863 B2 * | 3/2011 | Yamada | ................ | G03F 7/0752 430/286.1 |
| 2002/0058758 A1 * | 5/2002 | Culbertson | .......... | C09D 123/02 525/240 |
| 2007/0160933 A1 * | 7/2007 | Onoda | ...................... | G03F 7/32 430/302 |
| 2009/0176176 A1 | 7/2009 | Araki et al. | | |
| 2012/0251834 A1 | 10/2012 | Yoshimoto et al. | | |
| 2015/0336371 A1 | 11/2015 | Yawata et al. | | |

FOREIGN PATENT DOCUMENTS

| | | |
|---|---|---|
| JP | 63-88555 A | 4/1988 |
| JP | 2002-292985 A | 10/2002 |
| JP | 2003-287887 A | 10/2003 |
| JP | 2014-209229 A | 11/2014 |
| JP | 2016-71044 A | 5/2016 |
| JP | 2018-120131 A | 8/2018 |
| WO | 2005/064413 A1 | 7/2005 |
| WO | 2007/116941 A1 | 10/2007 |
| WO | 2011/081084 A1 | 7/2011 |

OTHER PUBLICATIONS

Extended (Supplementary) European Search Report dated Aug. 3, 2022, issued in counterpart EP application No. 19887529.6. (8 pages).
International Search Report dated Dec. 10, 2019, issued in counterpart International Application No. PCT/JP2019/036366. (2 pages).
Notification of Transmittal of Translation of the International Preliminary Report on Patentability (Form PCT/IB/338) issued in counterpart International Application No. PCT/JP2019/036366 dated Jun. 3, 2021 with Forms PCT/IB/373 and PCT/ISA/237. (6 pages).

* cited by examiner

*Primary Examiner* — John Zimmermann
(74) *Attorney, Agent, or Firm* — WHDA, LLP

(57) ABSTRACT

The present invention aims to provide a flexographic printing original plate which exhibits improved sustainability of the ability of preventing the plate surface from staining. According to the present invention, there is provided a water-developable flexographic printing original plate including at least a support and a photosensitive resin layer provided on the support, in which the photosensitive resin layer contains a water-dispersible latex, a photopolymerizable unsaturated compound, a photopolymerization initiator, and a silicone compound. When the water-dispersible latex is one or more latex rubbers selected from the group consisting of polybutadiene rubber and poly(nitrile-butadiene) rubber, the silicone compound is a silicone compound having an amino group in the molecule and has a refractive index of 1.44 to 1.60. When the water-dispersible latex is poly(styrene-butadiene) rubber, the silicone compound is a silicone compound having an amino group in the molecule and has a refractive index of 1.47 to 1.63.

7 Claims, No Drawings

WATER-DEVELOPABLE FLEXOGRAPHIC PRINTING ORIGINAL PLATE

TECHNICAL FIELD OF THE INVENTION

The present invention relates to a water-developable flexographic printing original plate exhibiting improved ability of preventing the plate surface from staining and improved sustainability of this effect.

BACKGROUND ART

Usually, flexographic printing original plates have a structure in which a photosensitive resin layer is provided on a support. Photosensitive resin compositions forming photosensitive resin layers generally contain a polymer compound such as water-dispersible latex, a photopolymerizable unsaturated compound, and a photopolymerization initiator as essential components, and additives such as stabilizers and plasticizers are blended in the photosensitive resin compositions if necessary.

General flexographic printing plates are produced, for example, by subjecting the above-mentioned original plates to exposure/development and post-exposure steps as described in Patent Document 1. The printing method using a flexographic printing plate is a method in which ink is supplied to a convex surface of the resin plate with concave and convex using an ink supply roll or the like, then the printing plate is brought into contact with a material to be printed, and the ink on the convex surface is transferred to the material to be printed. In such flexographic printing, it often occurs during printing over a long time that the ink adheres to a shoulder part of the convex portion of the printing plate or the ink enters the concave portion (hereinafter referred to as "plate surface staining"). As a result, even a part that is not an original pattern is printed in some cases and a decrease in printing quality is caused. When such a decrease in printing quality is caused, it is required to stop the printing once and to wipe the surface of the printing plate with a cloth and the like using a cleaning solution. This leads to a decrease in printing efficiency.

Especially in recent years, an application of flexographic printing to high-definition printing has advanced, and halftone dot printing with a great number of lines is actively performed in order to produce gradation of color and density. In this case, a distance between halftone dots becomes smaller, and the ink is thus more easily clogged and likely to accumulate in a halftone dot valley of the printing plate. When the ink accumulates in the halftone dot valley of the printing plate more than a certain amount, a problem arises that this ink is transferred to the material to be printed, dot entanglement occurs, and a significant decrease in printing quality is led.

Several methods have been so far proposed in order to prevent surface staining of flexographic printing plates. For example, Patent Document 2 proposes a method in which a printing plate formed of an elastomer is coated with a mixture of a water-based emulsion of an unmodified silicone compound and an aqueous resin by utilizing an ink repellency of silicone compound. In this method, since an unmodified silicone compound is used, the silicone compound is hardly fixed to the plate surface. Accordingly, the ability of preventing the plate surface from staining is not sufficient.

As an improved method of Patent Document 2, Patent Document 3 proposes a method in which a solution containing a modified silicone compound is brought into contact with the printing plate after an exposure step at the time of flexographic printing plate making. In this method, fixing of the silicone compound to the plate surface is promoted by using a modified silicone compound, and the ability of preventing the plate surface from staining is improved. However, in a long-run printing, staining of plate surface occurs in high-resolution halftone dot printing, and the sustainability of this effect of preventing the plate surface from staining cannot be said to be sufficient.

Patent Document 4 proposes a method in which a liquid containing an amino-modified silicone compound is brought into contact with a flexographic printing plate containing a latex having a gelation degree of 50% by mass or more. By this method, it is expected to obtain a certain degree of ability of preventing the plate surface from staining by an interaction between the amino-modified silicone compound and the gelled latex and/or an interaction between the amino-modified silicone compound and an emulsifier. However, neither the prevention of plate surface staining nor its sustainability is satisfactory, and it cannot be said that the method of Patent Document 4 is sufficient for high-quality mass printing.

Patent Document 5 proposes a solvent-developable flexographic printing original plate having a photosensitive resin layer formed of a photosensitive resin composition containing a diene-based block copolymer as a water-dispersible polymer compound and further containing silicone oil. In this original plate, the photosensitive resin layer contains an ink-repellent component, and thus the sustainability of the effect of preventing the plate surface from staining is superior to that by the method in which the ink-repellent component is brought into contact with the plate surface as in Patent Documents 3 and 4. However, the method of Patent Document 5 has a problem that a light scattering increases in accordance with an increase of a content of silicone compound in the photosensitive resin layer, which leads to a decrease in an image reproducibility. Hence, in the method of Patent Document 5, the content of silicone compound in the photosensitive resin layer is limited to a small amount of 0.05% by mass to 1.0% by mass, and it is not possible to increase the amount of ink-repellent component present on the surface of the printing plate. For this reason, sufficient ability of preventing the plate surface from staining is not achieved by the method of Patent Document 5.

PRIOR ART DOCUMENTS

Patent Documents

Patent Document 1: Japanese Patent Application Laid-Open (JP-A) No. 88555/88
Patent Document 2: Japanese Patent Application Laid-Open (JP-A) No. 2002-292985
Patent Document 3: WO 2005/064413
Patent Document 4: WO 2011/081084
Patent Document 5: WO 2007/116941

DISCLOSURE OF THE INVENTION

Problem that the Invention is to Solve

The present invention has been devised in view of the current state of the prior art. The object thereof is to propose a method by which the decrease in image reproducibility due to the light scattering is not caused even when the content of silicone compound in the photosensitive resin layer in the invention of Patent Document 5 is increased so as to sufficiently enjoy the effect of the sustainability of the ability of preventing the plate surface from staining obtained by containing a silicone compound.

In order to achieve the object, the present inventors have diligently investigated a cause of the light scattering problem arising when the content of silicone compound in a photosensitive resin layer is increased. As a result, it has been found out that there is a large difference between a refractive index of a water-dispersible polymer compound in a photosensitive resin layer and a refractive index of a silicone compound, and that this difference causes the light scattering problem. It has been found out that the refractive index of the silicone compound can be brought closer to the refractive index of the water-dispersible polymer compound by introducing a group containing an aromatic ring such as a phenyl group into the silicone compound so as to match the refractive index of the water-dispersible polymer compound and the refractive index of the silicone compound in order to solve the problem. As a result, the light scattering can be prevented, the content of silicone compound can be greatly increased, and the ability of preventing the plate surface from staining at the initial stage of printing can be dramatically improved. It has been found out that the silicone compound is fixed in the composition by further introducing an amino group into the silicone compound and the sustainability of the ability of preventing the plate surface from staining can be dramatically improved. The present invention has been completed based on these findings.

In other words, the present invention has the following configurations (1) to (7).

(1) A water-developable flexographic printing original plate including at least a support and a photosensitive resin layer provided on the support, in which the photosensitive resin layer contains a water-dispersible latex, a photopolymerizable unsaturated compound, a photopolymerization initiator, and a silicone compound, in which the water-dispersible latex is one or more latex rubbers selected from the group consisting of polybutadiene rubber and poly(nitrile-butadiene) rubber, and in which the silicone compound is a silicone compound having an amino group in the molecule and has a refractive index of 1.44 to 1.60.

(2) A water-developable flexographic printing original plate including at least a support and a photosensitive resin layer provided on the support, in which the photosensitive resin layer contains a water-dispersible latex, a photopolymerizable unsaturated compound, a photopolymerization initiator, and a silicone compound, in which the water-dispersible latex is poly(styrene-butadiene) rubber, and in which the silicone compound is a silicone compound having an amino group in the molecule and has a refractive index of 1.47 to 1.63.

(3) The water-developable flexographic printing original plate according to (1) or (2), in which the silicone compound is a silicone compound having an amino group and a group containing an aromatic ring in the molecule.

(4) The water-developable flexographic printing original plate according to (3), in which the group containing an aromatic ring is a phenyl group.

(5) The water-developable flexographic printing original plate according to (3) or (4), in which an amino group equivalent in the silicone compound is 500 to 10,000 g/mol and an equivalent of the group containing an aromatic ring in the silicone compound is 20 to 1,000 g/mol.

(6) The water-developable flexographic printing original plate according to any one of (1) to (5), in which a number average molecular weight of the silicone compound is 500 to 50,000.

(7) The water-developable flexographic printing original plate according to any one of (1) to (6), in which a content of the silicone compound in the photosensitive resin layer is 0.1% to 10% by mass.

Effects of the Invention

According to the present invention, the light scattering problem due to the difference in refractive index between the water-dispersible polymer compound and the ink-repellent silicone compound does not arise even when a sufficient amount of the ink-repellent silicone compound is contained in the printing plate. Accordingly, it is possible to provide a flexographic printing original plate which exhibits dramatically improved sustainability of the ability of preventing the plate surface from staining and enables high-quality mass printing.

BEST MODE FOR CARRYING OUT THE INVENTION

Hereinafter, the water-developable flexographic printing original plate of the present invention will be explained. The water-developable flexographic printing original plate of the present invention has basic configurations including at least a support and a photosensitive resin layer provided on the support.

As the support, conventionally known ones such as steel, aluminum, glass, and plastic films including a polyester film can be used. Generally, a film having a thickness in a range of 50 to 500 μm is used as the support.

In the present invention, the photosensitive resin layer contains a water-dispersible latex, a photopolymerizable unsaturated compound, a photopolymerization initiator, and a silicone compound. Each component will be explained hereinafter.

The water-dispersible latex is a hydrophobic polymer constituting a main component of the photosensitive resin layer. In the present invention, the water-dispersible latex is (1) one or more latex rubbers selected from the group consisting of polybutadiene rubber and poly(nitrile-butadiene) rubber or (2) poly(styrene-butadiene) rubber. In the case of (1), either of polybutadiene rubber or poly(nitrile-butadiene) rubber may be used, but it is preferable to use both of these for high-quality printing with excellent fine image reproducibility. These water-dispersible latexes may be modified with (meth)acryl, carboxy, silicone, fluorine and the like if desired. As the water-dispersible latex, a large number of various synthetic latexes and natural latexes are commercially available. Accordingly, appropriate one may be selected from these.

An amount of the water-dispersible latex blended in the photosensitive resin layer is preferably 40% to 80% by mass. A strength as a printing plate may be insufficient when the amount is less than 40% by mass. It may take time for water development when the amount exceeds 80% by mass.

The photopolymerizable unsaturated compound is polymerized and cross-linked by being irradiated with light to form a dense network for a shape maintenance of the printing plate. Preferably, the photopolymerizable unsaturated compound contains a photopolymerizable oligomer. The photopolymerizable oligomer is a polymer in which an ethylenically unsaturated group is bonded to a terminal and/or side chain of a conjugated diene-based polymer and is preferably one having a number average molecular weight of 1000 to 10000.

The conjugated diene-based polymer is composed of a homopolymer of a conjugated diene unsaturated compound or a copolymer of a conjugated diene unsaturated compound and a monoethylenically unsaturated compound. Examples of such copolymers include butadiene polymer, isoprene polymer, chloroprene polymer, styrene-chloroprene copolymer, acrylonitrile-butadiene copolymer, acrylonitrile-isoprene copolymer, methyl methacrylate-isoprene copolymer, acrylonitrile-isoprene copolymer, methyl methacrylate-isoprene copolymer, methyl methacrylate-chloroprene copolymer, methyl acrylate-butadiene copolymer, methyl acrylate-isoprene copolymer, methyl acrylate-chloroprene copolymer, acrylonitrile-butadiene-styrene copolymer, and acrylonitrile-chloroprene-styrene copolymer. Among these, butadiene polymer, isoprene polymer, and acrylonitrile-butadiene copolymer are preferable, and butadiene polymer and isoprene polymer are especially preferable in terms of rubber elasticity and photocurability.

As to the photopolymerizable unsaturated compound, generally used photopolymerizable monomers such as meth-a(a)crylates can be used if necessary in addition to those exemplified above, as long as the effects of the present invention are not impaired. An amount of the photopolymerizable unsaturated compound blended in the photosensitive resin layer is preferably 10% to 45% by mass. A toughness may be deteriorated when the amount of photopolymerizable unsaturated compound blended is less than 10% by mass. A developability may be deteriorated when the content of photopolymerizable unsaturated compound exceeds 45% by mass.

The photopolymerization initiator is not particularly limited as long as it can polymerize a polymerizable carbon-carbon unsaturated group with light. Among these, those having a function of generating radicals by autolysis or hydrogen abstraction by light absorption are preferably used. Specific examples thereof include benzoin alkyl ethers, benzophenones, anthraquinones, benzyls, acetophenones, and diacetyls. An amount of the photopolymerization initiator blended in the photosensitive resin layer is preferably 0.1% to 10% by mass. A starting efficiency decreases and the image reproducibility is poor when the amount of photopolymerization initiator blended is less than 0.1% by mass. A sensitivity increases and it is difficult to control an exposure time when the amount of photopolymerization initiator blended exceeds 10% by mass.

The silicone compound has a role of preventing the printing plate surface from staining by its ink repellency. The silicone compound used in the present invention is required to be an amino-modified silicone compound having an amino group in the molecule. When the amino-modified silicone compound is used, the effect of preventing the plate surface from staining by the silicone compound can be sustainably exerted. It is considered that this is because the amino group in the molecule is added to the double bond in the photopolymerizable unsaturated compound by Michael reaction, the silicone compound is fixed in the photosensitive resin layer, and a migration of the silicone compound during printing is blocked. A position of the amino group in the molecule is not limited, and examples thereof include a terminal position and a side chain position. A number of amino groups may be one or more, and the silicone compound may have amino groups at a plurality of sites. The silicone compound may have functional groups other than an amino group.

An amino group equivalent in the amino-modified silicone compound is preferably in a range of 500 g/mol to 10,000 g/mol and further preferably in a range of 1,000 g/mol to 5,000 g/mol. The initial ink repellent effect may be poor when the amino group equivalent is less than the lower limit. The effect sustainability may be poor when the amino group equivalent exceeds the upper limit.

A kinematic viscosity of the amino-modified silicone compound is not particularly limited but is preferably in a range of 20 to 5000 mm$^2$/s and further preferably in a range of 40 to 1000 mm$^2$/s. The ink repellency may be poor when the kinematic viscosity is less than the lower limit. A dissolution stability may be poor when the ink repellency exceeds the upper limit.

The silicone compound used in the present invention is required to have a refractive index in a specific range depending on a kind of water-dispersible latex contained in the photosensitive resin layer, specifically, to have a refractive index in a specific range close to a refractive index of polybutadiene rubber, poly(nitrile-butadiene) rubber, or poly(styrene-butadiene) rubber constituting the water-dispersible latex. More specifically, the silicone compound is required to have a refractive index of 1.44 to 1.60, preferably 1.46 to 1.58, when the water-dispersible latex is one or more latex rubbers selected from the group consisting of polybutadiene rubber and poly(nitrile-butadiene) rubber (the refractive indexes thereof are all 1.52). The silicone compound is required to have a refractive index of 1.47 to 1.63, preferably 1.49 to 1.61, when the water-dispersible latex is poly(styrene-butadiene) rubber (the refractive index thereof is 1.55). This is based on the idea that the refractive index of the silicone compound is brought close to the refractive index of the water-dispersible latex based on the findings by the present inventors that the difference between the refractive index of water-dispersible latex and the refractive index of silicone compound causes the decrease in image reproducibility due to the light scattering. The refractive index of the above-mentioned water-dispersible latex is 1.52 for polybutadiene rubber and poly(nitrile-butadiene) rubber and 1.55 for poly(styrene-butadiene) rubber, but the refractive index of the silicone compound is extremely lower than the values of these and is only about 1.4. Because of this difference in refractive index, the light scattering occurs at an interface between the silicone compound and the water-dispersible latex when the silicone compound is blended in the photosensitive resin layer of the printing original plate and mixed with the water-dispersible latex, whereby the image reproducibility decreases. In the present invention, the difference in refractive index between the silicone compound and the water-dispersible latex is suppressed in a small range by increasing the refractive index of the silicone compound to a value higher than the usual value, whereby the occurrence of light scattering at the interface between the silicone compound and the water-dispersible latex as described above is prevented. As a result, the decrease in image reproducibility is prevented. As described above, the silicone compound used in the present invention does not cause the decrease in image reproducibility even when being blended in the photosensitive resin layer of the printing original plate unlike the conventional one. Accordingly, the silicone compound used in the present invention can be blended in an amount sufficient to exert a high level of plate surface staining-prevention effect that is required to realize high-quality mass printing.

A method for controlling the refractive index of silicone compound is not particularly limited, and examples thereof include a method in which a group containing an aromatic ring is introduced into a silicone compound having an amino group in the molecule. The silicone compound has a low refractive index that is still greatly different from the refractive index of the water-dispersible latex in a state in which an amino group is simply introduced. However, the refractive index of the silicone compound can be increased by introducing a bulky aromatic ring and the difference in refractive index between the silicone compound and the water-dispersible latex can be minimized. The group containing an aromatic ring is not particularly limited but is preferably, for example, a phenyl group, a styryl group, or a naphthyl group. A phenyl group is especially preferably.

An equivalent of the group containing an aromatic ring in the silicone compound is preferably 20 to 1,000 g/mol and further preferably 50 to 500 g/mol. The ink repellency may be insufficient when the equivalent of the group containing an aromatic ring is less than the lower limit. The effect of increasing the refractive index may be insufficient and the light scattering may occur at the interface with the water-dispersible latex when the equivalent exceeds the upper limit.

As to the silicone compound having an amino group and a group containing an aromatic ring in the molecule which is used in the present invention, for example, the following products are available from the market. In other words, examples of the silicone compound having an amino group and a phenyl group in the molecule include X22 1660B-3 and X22 9409 manufactured by Shin-Etsu Chemical Co., Ltd. Those that are not available from the market can be synthesized, for example, by appropriately referring to a synthesis method disclosed in Japanese Patent Application Laid-Open (JP-A) No. 197486/91, Japanese Patent Application Laid-Open (JP-A) No. 34855/96, Japanese Patent Application Laid-Open (JP-A) No. 2006-213856, and Japanese Patent Application Laid-Open (JP-A) No. 2017-52737.

A number average molecular weight of the silicone compound used in the present invention is preferably 500 to 50,000 and more preferably 1,000 to 10,000. The ink repellency may be insufficient when the number average molecular weight is less than the lower limit. A compatibility with the photosensitive resin may decrease when the number average molecular weight exceeds the upper limit.

In the printing original plate of the present invention, a content of the silicone compound in the photosensitive resin layer is preferably 0.1% to 10% by mass and more preferably 0.2% to 5% by mass. The effect of preventing the plate surface from staining by the ink repellency of silicone compound may not be sufficiently exerted when the content of silicone compound is less than the lower limit. A mechanical strength of the printing plate may decrease when the content exceeds the upper limit. In the present invention, the occurrence of light scattering and the decrease in image reproducibility caused thereby are prevented by matching the refractive index of silicone compound with the refractive index of the water-dispersible latex, as explained above. Accordingly, the silicone compound can be blended in an amount sufficient to exert a high level of plate surface staining-prevention effect that is required to realize high-quality mass printing.

In addition to the above components, a hydrophilic polymer can be added to the photosensitive resin layer of the printing original plate of the present invention. As to the hydrophilic polymer, those having a hydrophilic group such as —COOH, —COOM (M is a monovalent, divalent or trivalent metal ion or substituted or unsubstituted ammonium ion), —OH, —NH$_2$, —SO$_3$H, and a phosphoric acid ester group are preferable. Specific examples thereof include a polymer of (meth)acrylic acid or a salt thereof, a copolymer of (meth)acrylic acid or a salt thereof and an alkyl (meth)acrylate, a copolymer of (meth)acrylic acid or a salt thereof and a styrene, a copolymer of (meth)acrylic acid or a salt thereof and a vinyl acetate, a copolymer of (meth) acrylic acid or a salt thereof and an acrylonitrile, polyvinyl alcohol, carboxymethyl cellulose, polyacrylamide, hydroxyethyl cellulose, polyethylene oxide, polyethyleneimine, polyurethane having a —COOM group, polyureaurethane having a —COOM group, and polyamic acids having a —COOM group and salts or derivatives thereof. An amount of the hydrophilic polymer blended in the photosensitive resin layer is preferably 2% to 30% by mass. A developability may be deteriorated when the amount of hydrophilic polymer blended is less than 2% by mass. A water resistance of relief may be deteriorated when the amount of hydrophilic polymer blended exceeds 30% by mass.

A thermal polymerization inhibitor (stabilizer) can be added to the photosensitive resin layer of the printing original plate of the present invention from the viewpoints of enhancing thermal stability at the time of kneading and storage stability, and the like. An amount of the thermal polymerization inhibitor (stabilizer) blended in the photosensitive resin layer is generally 0.001% to 5% by mass. Examples of the thermal polymerization inhibitor include phenols, hydroquinones, and catechols.

Other components such as plasticizers, UV absorbers, dyes, pigments, defoamers, anti-aggregation agents, silicone compounds, and fluorine compounds can be appropriately added to the photosensitive resin layer of the printing original plate of the present invention for the purpose of improving various properties, as long as the effects of the present invention are not impaired.

The printing original plate of the present invention can be prepared by molding a photosensitive resin composition containing the above-mentioned components into a photosensitive resin layer by any known method, for example, heat pressing, casting, melt extrusion, or solution casting in addition to a melt molding method, and then laminating this molded photosensitive resin layer on a support with an adhesive layer interposed therebetween. When a laminate in which the photosensitive resin layer is laminated on the support is supplied, it is preferable that a protective layer (cover film) is further laminated on the photosensitive resin layer. As to the protective layer, one in which a plastic film, for example, a polyester film having a thickness of 125 μm is coated with an infrared ablation layer may be used. It is also possible to provide a barrier layer between the infrared ablation layer and the photosensitive resin layer.

In the printing original plate of the present invention, an image is drawn on the infrared ablation layer using an imaging apparatus and then the image is irradiated with active light rays from above to be exposed. By this, only the exposed portion is insolubilized and cured. For the active light rays, it is preferable to use a light source such as a high-pressure mercury lamp, an ultra-high-pressure mercury lamp, a metal halide lamp, a xenon lamp, or a chemical lamp usually having a wavelength of 300 to 450 nm as the central wavelength. Subsequently, the unexposed portion is dissolved and removed with a suitable solvent, particularly neutral water to obtain a printing plate having a clear image portion. For this purpose, it is preferable to use a spray-type developing device, a brush-type developing device, or the like.

EXAMPLES

As hereunder, the effects of the printing original plate of the present invention will be illustrated by referring to Examples although the present invention is not limited to those Examples. A term "part(s)" in Examples stand(s) for part(s) by mass, and values shown in Tables which indicate a composition ratio also stand for part(s) by mass.

Example 1

Preparation of Photosensitive Resin Composition

A dope was prepared by mixing 76 parts by mass of butadiene latex (Nipol LX111NF manufactured by ZEON CORPORATION, non-volatile components: 55%) and 17 parts by mass of acrylonitrile-butadiene latex (Nipol SX1503 manufactured by ZEON CORPORATION, non-volatile components: 42%) as water-dispersible latex, 19 parts by mass of oligo(butadiene acrylate) (ABU-4S manufactured by KYOEISHA CHEMICAL CO., LTD.), 7.5 parts by mass of lauryl methacrylate (LIGHT ESTER L manufactured by KYOEISHA CHEMICAL CO., LTD.), and 7.5 parts by mass of trimethylolpropane triacrylate (LIGHT ESTER TMP manufactured by KYOEISHA CHEMICAL CO., LTD.) as photopolymerizable unsaturated compounds, 1 part by mass of photopolymerization initiator (Irgacure 651), 1 part by mass of silicone compound (X22 1660B-3 manufactured by Shin-Etsu Chemical Co., Ltd.), and 20 parts by mass of hydrophilic polymer (PFT-3 manufactured by KYOEISHA CHEMICAL CO., LTD., non-volatile components: 25%), 9.9 parts by mass of butadiene oligomer (B2000 manufactured by NIPPON SODA CO., LTD.), and 0.1 parts by mass of a heat stabilizer (4-methoxyphenol) as other components in a container. The dope was put into a pressurized kneader, and toluene and water were removed therefrom under reduced pressure at 80° C. to obtain a photosensitive resin composition. The silicone compound used in this Example was a silicone compound having an amino group and a phenyl group in the molecule. The refractive index thereof was 1.50, the amino group equivalent was 2200 g/mol, the molar ratio of diphenylsiloxane unit/dimethylsiloxane unit was 27/73, the phenyl group equivalent was 210 g/mol, and the number average molecular weight was 4400. In each of Examples and Comparative Examples, the refractive index was measured using a hand-held refractometer manufactured by ATAGO CO., LTD. The refractive index was measured at 25° C. using the D line of sodium spectrum as light rays.

Preparation of Flexographic Printing Original Plate

Carbon black dispersion (AMBK-8 manufactured by ORIENT CHEMICAL INDUSTRIES CO., LTD.), copolymerized polyamide (PA223 manufactured by TOYOBO CO., LTD.), propylene glycol, and methanol were mixed at a mass proportion of 45/5/5/45 to obtain an infrared ablation layer coating solution. After a releasing treatment was performed on both sides of a PET film (E5000 manufactured by TOYOBO CO., LTD., thickness: 100 μm), the infrared ablation layer coating solution was applied onto the PET film using a bar coater so that a thickness of a coating film after being dried was 2 μm, and dried at 120° C. for 5 minutes to obtain a film laminate (I). An optical density thereof was 2.3. The optical density was measured using a black-and-white transmission densitometer DM-520 (SCREEN Holdings Co., Ltd.). Polyvinyl acetate (KH20 manufactured by NIHON GOSEI KAKO Co., Ltd.) having a saponification degree of 80% and a plasticizer (glycerin) were mixed at a mass proportion of 70/30 to obtain a barrier layer coating solution. The barrier layer coating solution was applied onto the film laminate (I) using a bar coater so that a thickness of a coating film after being dried was 2.0 μm, and dried at 120° C. for 5 minutes to obtain a film laminate (II). The photosensitive resin composition was disposed on a PET film support (E5000 manufactured by TOYOBO CO., LTD., thickness: 125 μm) coated with a copolymerized polyester-based adhesive, and the film laminate (II) was superposed on the photosensitive resin composition. These were laminated at 100° C. using a heat pressing machine to obtain a flexographic printing original plate including a PET support, an adhesive layer, a photosensitive resin layer, a barrier layer, an infrared ablation layer, and a cover film. A total thickness of the plate was 1.70 mm.

Preparation of Printing Plate from Flexographic Printing Original Plate

The printing original plate was irradiated with actinic rays (light source: Philips 10R, illuminance: 8 mW/cm² at 365 nm) from the PET support side for 1 minute. Subsequently, the cover film was peeled off. This plate was wrapped around Esko CDI SPARK2530 and ablated with a test image with 200-line 1% halftone dots and 300 μm wide slits. After the ablation, the plate was taken out, returned to the plane shape, and irradiated with actinic rays (light source: Philips 10R, illuminance: 8 mW/cm² at 365 nm) for 10 minutes. Thereafter, development was performed for 8 minutes using a developing machine (Stuck System, 1% aqueous washing soap solution, 40° C.) manufactured by A & V Co., Ltd., and water droplets on the plate surface were removed with a drain stick. Thereafter, the plate was dried in a dryer at 60° C. for 10 minutes, irradiated with actinic rays for 10 minutes, and finally irradiated with light from a germicidal lamp for 5 minutes to eliminate a surface adhesive property, and a flexographic printing plate was thus obtained.

Examples 2 to 16 and Comparative Examples 1 to 9

Photosensitive resin compositions, flexographic printing original plates, and flexographic printing plates were prepared in the same manner as in Example 1 except that the composition of the photosensitive resin layer (photosensitive resin composition) in the printing original plate was changed as presented in Table 1 or Table 2.

A method for synthesizing the silicone compound of Synthesis Example 1 to the silicone compound of Synthesis Example 4 in Table 1 was as follows.

As a synthetic raw material, the following side chain phenyl group-modified dimethylsiloxane having a hydroxy group at a terminal was prepared.

A-1: Organopolysiloxane having terminal OH, number average molecular weight of about 2100, and diphenylsiloxane unit/dimethylsiloxane unit=37/63 (molar ratio)

A-2: Organopolysiloxane having terminal OH, number average molecular weight of about 2000, and diphenylsiloxane unit/dimethylsiloxane unit=17/83 (molar ratio)

A-3: Organopolysiloxane having terminal OH, number average molecular weight of about 2100, and diphenylsiloxane unit/dimethylsiloxane unit=29/71 (molar ratio)

A-4: Organopolysiloxane having terminal OH, number average molecular weight of about 8000, and diphenylsiloxane unit/dimethylsiloxane unit=30/70 (molar ratio)

Silicone Compound of Synthesis Example 1

An amino group was introduced into a terminal of the prepared synthetic raw material A-1 to obtain a silicone compound having an amino group and a phenyl group in the molecule. Specifically, 0.1 mol of the prepared synthetic raw material A-1 and 0.2 mol of N-β-(aminoethyl)-γ-aminopropylmethyldimethoxysilane were charged in a 1,000 ml glass flask equipped with an ester adapter, a condenser, and a thermometer, and the first-stage condensation reaction was conducted at 120° C. for 3 hours under nitrogen aeration. Distillation of methanol due to the reaction for methanol removal was observed in the ester adapter. After completion of the reaction, the obtained product was structurally identified by $^{29}$Si-NMR. As a result, the peak (−2.7 ppm) of N-β-(aminoethyl)-γ-aminopropylmethyldimethoxysilane that was a raw material disappeared and all the silanes were involved in the reaction. The obtained product was a silicone compound having an amino group and a phenyl group in the molecule. The refractive index thereof was 1.56, the amino group equivalent was 1250 g/mol, the phenyl group equivalent was 190 g/mol, and the number average molecular weight was 2500.

Silicone Compound of Synthesis Example 2

A silicone compound having an amino group and a phenyl group in the molecule was obtained by the same synthesis method as in Synthesis Example 1 except that the synthetic raw material was changed from A-1 to A-2. The obtained product was a silicone compound having an amino group and a phenyl group in the molecule. The refractive index thereof was 1.47, the amino group equivalent was 1200 g/mol, the phenyl group equivalent was 340 g/mol, and the number average molecular weight was 2400.

Silicone Compound of Synthesis Example 3

A silicone compound having an amino group and a phenyl group in the molecule was obtained by the same synthesis method as in Synthesis Example 1 except that the synthetic raw material was changed from A-1 to A-3. The obtained product was a silicone compound having an amino group and a phenyl group in the molecule. The refractive index thereof was 1.50, the amino group equivalent was 1250 g/mol, the phenyl group equivalent was 230 g/mol, and the number average molecular weight was 2500.

Silicone Compound of Synthesis Example 4

A silicone compound having an amino group and a phenyl group in the molecule was obtained by the same synthesis method as in Synthesis Example 1 except that the synthetic raw material was changed from A-1 to A-4. The obtained product was a silicone compound having an amino group and a phenyl group in the molecule. The refractive index thereof was 1.50, the amino group equivalent was 4200 g/mol, the phenyl group equivalent was 190 g/mol, and the number average molecular weight was 8400.

The light scattering property, image reproducibility, and plate surface staining of the printing plates of Examples 1 to 16 and Comparative Examples 1 to 9 were evaluated by the following procedures. The results are presented in Table 1 and Table 2, respectively.

Details of the water-dispersible latexes, solid rubbers, and silicone compounds in Table 1 and Table 2 are as follows.
(Water-Dispersible Latexes)
Polybutadiene rubber: Butadiene latex (Nipol LX111NF manufactured by ZEON CORPORATION, non-volatile components: 55%)

Poly(nitrile-butadiene) rubber: Acrylonitrile-butadiene latex (Nipol SX1503 manufactured by ZEON CORPORATION, non-volatile components: 42%)
Poly(styrene-butadiene) rubber: Styrene-butadiene latex (Nipol LX432A manufactured by ZEON CORPORATION, non-volatile components: 41%)
(Solid Rubbers)
Polybutadiene rubber: Polybutadiene rubber (Nipol BR1241 manufactured by ZEON CORPORATION)
Poly(styrene-butadiene) rubber: Styrene-butadiene rubber by solution polymerization (Nipol NS112R manufactured by ZEON CORPORATION)
(Silicone Compounds)
X22 1660B-3: Silicone compound having an amino group and a phenyl group in the molecule. Refractive index: 1.50, amino group equivalent: 2200 g/mol, phenyl group equivalent: 210 g/mol, number average molecular weight: 4400, manufactured by Shin-Etsu Chemical Co., Ltd.
Silicone compound of Synthesis Example 1: Silicone compound having an amino group and a phenyl group in the molecule. Refractive index: 1.56, amino group equivalent: 1250 g/mol, phenyl group equivalent: 190 g/mol, number average molecular weight: 2500.
Silicone compound of Synthesis Example 2: Silicone compound having an amino group and a phenyl group in the molecule. Refractive index: 1.47, amino group equivalent: 1200 g/mol, phenyl group equivalent: 340 g/mol, number average molecular weight: 2400.
Silicone compound of Synthesis Example 3: Silicone compound having an amino group and a phenyl group in the molecule. Refractive index: 1.50, amino group equivalent: 1250 g/mol, phenyl group equivalent: 230 g/mol, number average molecular weight: 2500.
Silicone compound of Synthesis Example 4: Silicone compound having an amino group and a phenyl group in the molecule. Refractive index: 1.50, amino group equivalent: 4200 g/mol, phenyl group equivalent: 190 g/mol, number average molecular weight: 8400.
KF8012: Silicone compound having an amino group in the molecule. Refractive index: 1.41, amino group equivalent: 2200 g/mol, manufactured by Shin-Etsu Chemical Co., Ltd.
KF-1005: Silicone compound having an epoxy-aralkyl group in the molecule. Refractive index: 1.48, manufactured by Shin-Etsu Chemical Co., Ltd.
KF50-300: Silicone compound having a phenyl group in the molecule. Refractive index: 1.49, manufactured by Shin-Etsu Chemical Co., Ltd.
KF96-500: Unmodified silicone compound. Refractive index: 1.40, manufactured by Shin-Etsu Chemical Co., Ltd.
(1) Light Scattering Property
The photosensitive resin composition prepared in each of Examples and Comparative Examples was sandwiched between PET films and pressed so as to have a film thickness of 0.25 mm. Next, the front and back of the pressed product were irradiated with actinic rays (light source: Philips 10R, illuminance: 8 mW/cm² at 365 nm) for 10 minutes to prepare a sample for measurement of light scattering property. With regard to this sample, a light scattering rate of the photosensitive resin composition at λ=365 nm was measured using a spectrophotometer (U-3210 manufactured by Hitachi, Ltd. with 150φ integrating sphere accessory). Light scattering property was judged according to the following criteria. When the light scattering rate is 20% or less: ⊚, when the light scattering rate is larger than 20% and 40% or less: ○, when the light scattering rate is larger than 40% and 60% or less: Δ, and when the light scattering rate is larger than 60%: ×

(2) Image Reproducibility

As to an index of image reproducibility, a depth of a slit having a width of 300 μm of the flexographic printing plate prepared in each of Examples and Comparative Examples was measured. Specifically, the flexographic printing plate was magnified 100-fold using a universal projector, and a slit depth (μm) of 300 μm was measured. It can be said that the image reproducibility is superior as this measured value is larger.

(3) Evaluation of Plate Surface Staining

For the flexographic printing plate prepared in each of Examples and Comparative Examples, plate surface staining was evaluated using a flexographic printing machine FPR302 (manufactured by MCK CO., LTD.) and Anilox with 800 LPI. As to the ink, UV ink (trade name: FLEXOCURE CYAN (manufactured by Flint)) was used. As to the material to be printed, coated paper (trade name: Pearl Coat manufactured by Oji Paper Co., Ltd.) was used. A printing speed was 50 m/min. Under the conditions, printing was firstly performed by 500 m, and a printing sample was collected. Subsequently, printing was performed by 500 m, and a sample was obtained after printing was performed by a total of 1000 m. Printing was further performed, and a sample was obtained after printing was performed by a total of 1500 m. Finally, printing was further performed, and a sample was obtained after printing was performed by a total of 2000 m. Plate surface staining was evaluated with 200-line halftone dots. Plate surface staining was judged according to the following criteria. When the plate surface staining did not occur at all: "A", when the plate surface staining occurred only at the halftone dot end: "B", when the plate surface staining occurred in the vicinity of the halftone dot end: "C", and when the plate surface staining occurred on the entire halftone dot surface: "D"

TABLE 1

| | | | Examples | | | | | | | |
|---|---|---|---|---|---|---|---|---|---|---|
| | | | 1 | 2 | 3 | 4 | 5 | 6 | 7 | 8 |
| Composition of photosensitive resin layer | water-dispersible latex | polybutadiene rubber | 42.0 | 42.0 | 42.0 | 42.0 | 42.0 | 42.0 | 42.0 | 42.0 |
| | | poly(nitrile-butadiene) rubber | 7.0 | 7.0 | 7.0 | 7.0 | 7.0 | 7.0 | 7.0 | 7.0 |
| | | poly(styrene-butadiene) rubber | | | | | | | | |
| | solid rubber | polybutadiene rubber | | | | | | | | |
| | | poly(styrene-butadiene) rubber | | | | | | | | |
| | photopolymerizable unsaturated compound | oligo(butadiene acrylate) | 19.0 | 19.0 | 19.0 | 19.0 | 19.0 | 19.0 | 19.0 | 19.0 |
| | | lauryl methacrylate | 7.5 | 7.5 | 7.5 | 7.5 | 7.5 | 7.5 | 7.5 | 7.5 |
| | | trimethylolpropane triacrylate | 7.5 | 7.5 | 7.5 | 7.5 | 7.5 | 7.5 | 7.5 | 7.5 |
| | photopolymerization initiator | Irgacure 651 | 1.0 | 1.0 | 1.0 | 1.0 | 1.0 | 1.0 | 1.0 | 1.0 |
| | hydrophilic polymer | PFT-3 | 5.0 | 5.0 | 5.0 | 5.0 | 5.0 | 5.0 | 5.0 | 5.0 |
| | plasticizer | butadiene oligomer | 9.9 | 10.7 | 7.9 | 5.9 | 3.9 | 7.9 | 7.9 | 7.9 |
| | heat stabilizer | 4-methoxyphenol | 0.1 | 0.1 | 0.1 | 0.1 | 0.1 | 0.1 | 0.1 | 0.1 |
| | silicone compound | X22 1660B-3 | 1.0 | 0.2 | 3.0 | 5.0 | 7.0 | | | |
| | | silicone compound of Synthesis Example 1 | | | | | | 3.0 | | |
| | | silicone compound of Synthesis Example 2 | | | | | | | 3.0 | |
| | | silicone compound of Synthesis Example 3 | | | | | | | | 3.0 |
| | | silicone compound of Synthesis Example 4 | | | | | | | | |
| Evaluation | | light scattering property | ⊚ | ⊚ | ⊚ | ⊚ | ○ | ⊚ | ○ | ⊚ |
| | | image reproducibility/depth of slit (μm) | 130 | 130 | 130 | 120 | 110 | 130 | 110 | 130 |
| | plate surface staining | after printing was performed by 500 m | A | A | A | A | A | A | A | A |
| | | after printing was performed by 1000 m | A | A | A | A | A | A | A | A |
| | | after printing was performed by 1500 m | A | A | A | A | A | A | A | A |
| | | after printing was performed by 2000 m | A | B | A | A | A | A | A | A |

| | | | Examples | | | | | | |
|---|---|---|---|---|---|---|---|---|---|
| | | | 9 | 10 | 11 | 12 | 13 | 14 | 15 | 16 |
| Composition of photosensitive resin layer | water-dispersible latex | polybutadiene rubber | 42.0 | 38.0 | 42.0 | 11.0 | 39.0 | | 42.0 | 38.0 |
| | | poly(nitrile-butadiene) rubber | 7.0 | 11.0 | 7.0 | | 6.0 | | 7.0 | 6.0 |
| | | poly(styrene-butadiene) rubber | | | | 38.0 | | 39 | | |
| | solid rubber | polybutadiene rubber | | | | 4.0 | | | | |
| | | poly(styrene-butadiene) rubber | | | | | 4.0 | | | |

TABLE 1-continued

| | | | | | | | | | | |
|---|---|---|---|---|---|---|---|---|---|---|
| | photopolymerizable unsaturated compound | oligo(butadiene acrylate) | 19.0 | 19.0 | 19.9 | 19.0 | 19.0 | 19.0 | 19.0 | 17.0 |
| | | lauryl methacrylate | 7.5 | 7.5 | 8.0 | 7.5 | 7.5 | 7.5 | 7.5 | 6.5 |
| | | trimethylolpropane triacrylate | 7.5 | 7.5 | 8.0 | 7.5 | 7.5 | 7.5 | 7.5 | 6.5 |
| | photopolymerization initiator | Irgacure 651 | 1.0 | 1.0 | 1.0 | 1.0 | 1.0 | 1.0 | 1.0 | 1.0 |
| | hydrophilic polymer | PFT-3 | 5.0 | 5.0 | 0.0 | 5.0 | 5.0 | 9.0 | 5.0 | 5.0 |
| | plasticizer | butadiene oligomer | 7.9 | 7.9 | 11 | 7.9 | 7.9 | 9.9 | 10.8 | 4.9 |
| | heat stabilizer | 4-methoxyphenol | 0.1 | 0.1 | 0.1 | 0.1 | 0.1 | 0.1 | 0.1 | 0.1 |
| | silicone compound | X22 1660B-3 | | 3.0 | 3.0 | 3.0 | 3.0 | 3.0 | 0.05 | 15 |
| | | silicone compound of Synthesis Example 1 | | | | | | | | |
| | | silicone compound of Synthesis Example 2 | | | | | | | | |
| | | silicone compound of Synthesis Example 3 | | | | | | | | |
| | | silicone compound of Synthesis Example 4 | 3.0 | | | | | | | |
| Evaluation | light scattering property | | ○○ | ○○ | ○○ | ○○ | ○○ | ○ | ○○ | △ |
| | image reproducibility/depth of slit (μm) | | 130 | 130 | 130 | 120 | 130 | 120 | 130 | 100 |
| | plate surface staining | after printing was performed by 500 m | A | A | A | A | A | A | A | A |
| | | after printing was performed by 1000 m | A | A | A | A | A | A | B | A |
| | | after printing was performed by 1500 m | A | A | A | A | A | A | B | A |
| | | after printing was performed by 2000 m | B | A | A | A | A | A | B | A |

TABLE 2

| | | | Comparative Examples | | | | | | | | |
|---|---|---|---|---|---|---|---|---|---|---|---|
| | | | 1 | 2 | 3 | 4 | 5 | 6 | 7 | 8 | 9 |
| Composition of photosensitive resin layer | water-dispersible latex | polybutadiene rubber | 42.0 | 42.0 | 42.0 | 42.0 | 44.0 | 38.0 | 38.0 | | |
| | | poly(nitrile-butadiene) rubber | 7.0 | 7.0 | 7.0 | 7.0 | 10.0 | 11.0 | 11.0 | | |
| | | poly(styrene-butadiene) rubber | | | | | | | | 39 | 39 |
| | solid rubber | polybutadiene rubber | | | | | | | | | |
| | | poly(styrene-butadiene) rubber | | | | | | | | 4.0 | 4.0 |
| | photopolymerizable unsaturated compound | oligo(butadiene acrylate) | 19.0 | 19.0 | 19.0 | 19.0 | 19.0 | 19.0 | 19.0 | 19.0 | 19.0 |
| | | lauryl methacrylate | 7.5 | 7.5 | 7.5 | 7.5 | 7.5 | 7.5 | 7.5 | 7.5 | 7.5 |
| | | trimethylolpropane triacrylate | 7.5 | 7.5 | 7.5 | 7.5 | 7.5 | 7.5 | 7.5 | 7.5 | 7.5 |
| | photopolymerization initiator | Irgacure 651 | 1.0 | 1.0 | 1.0 | 1.0 | 1.0 | 1.0 | 1.0 | 1.0 | 1.0 |
| | hydrophilic polymer | PFT-3 | 5.0 | 5.0 | 5.0 | 5.0 | 5.0 | 5.0 | 5.0 | 9.0 | 9.0 |
| | plasticizer | butadiene oligomer | 5.9 | 5.9 | 5.9 | 5.9 | 5.9 | 7.9 | 7.9 | 9.9 | 9.9 |
| | heat stabilizer | 4-methoxyphenol | 0.1 | 0.1 | 0.1 | 0.1 | 0.1 | 0.1 | 0.1 | 0.1 | 0.1 |
| | silicone compound | X22 1660B-3 | | | | | | | | | |
| | | amino-modified silicone compound (KF8012) | | 5 | | | | 3 | | 3 | |
| | | epoxy-modified silicone compound (KF1005) | | | 5 | | | | | | |
| | | phenyl-modified silicone compound (KF50-300) | | | | 5 | | | 3 | | 3 |
| | | unmodified silicone compound (KF96-500) | 5 | | | | | | | | |
| Evaluation | light scattering property | | x | x | ○ | ○○ | ○○ | x | ○○ | x | ○○ |
| | image reproducibility/depth of slit (μm) | | 20 | 30 | 100 | 130 | 130 | 30 | 130 | 30 | 130 |
| | plate surface staining | after printing was performed by 500 m | C | A | A | A | C | A | A | A | A |
| | | after printing was performed by 1000 m | D | A | B | B | D | A | B | A | B |
| | | after printing was performed by 1500 m | D | A | B | C | D | A | C | A | C |
| | | after printing was performed by 2000 m | D | A | C | D | D | A | D | A | D |

As can be seen from Tables 1 and 2, in all of Examples 1 to 16 in which the requirements of the present invention are satisfied, the image reproducibility is excellent as well as the plate surface staining at the time of printing can be improved since the light scattering rate is low. On the other hand, in Comparative Example 1 in which a silicone compound (KF96-500) which does not have any amino group in the molecule and has a too low refractive index is used, the image reproducibility is poor since the light scattering rate is high. In addition, the plate surface staining at the time of printing is significant. In Comparative Examples 2, 6, and 8 in which a silicone compound (KF8012) which has an amino group in the molecule but has a too low refractive index is used, the image reproducibility is poor since the light scattering rate is high. In Comparative Examples 3, 4, 7, and 9 in which a silicone compound (KF1005 or KF50-300) which has a high refractive index but does not have any amino group in the molecule is used, the plate surface staining at the time of printing is conspicuous. In Comparative Example 5 in which a silicone compound is not blended at all, the light scattering rate is low but the plate surface staining at the time of printing is significant.

INDUSTRIAL APPLICABILITY

According to the flexographic printing original plate of the present invention, it is possible to contain a sufficient amount of ink-repellent silicone compound in the printing plate without causing the problem of decrease in the image reproducibility due to the light scattering, and it is thus possible to dramatically improve sustainability of the ability of preventing the plate surface from staining and to realize high-quality mass printing. Therefore, the present invention is very useful.

The invention claimed is:

1. A water-developable flexographic printing original plate prior to exposure including at least a support and a photosensitive resin layer provided on the support, in which the photosensitive resin layer contains a water-dispersible latex, a photopolymerizable unsaturated compound, a photopolymerization initiator, and a silicone compound, in which the water-dispersible latex is one or more latex rubbers selected from the group consisting of polybutadiene rubber and poly(nitrile-butadiene) rubber, and in which the silicone compound is a silicone compound having an amino group in the molecule and has a refractive index of 1.44 to 1.60.

2. A water-developable flexographic printing original plate prior to exposure including at least a support and a photosensitive resin layer provided on the support, in which the photosensitive resin layer contains a water-dispersible latex, a photopolymerizable unsaturated compound, a photopolymerization initiator, and a silicone compound, in which the water-dispersible latex is poly(styrene-butadiene) rubber, and in which the silicone compound is a silicone compound having an amino group in the molecule and has a refractive index of 1.47 to 1.63.

3. The water-developable flexographic printing original plate according to claim 1, in which the silicone compound is a silicone compound having an amino group and a group containing an aromatic ring in the molecule.

4. The water-developable flexographic printing original plate according to claim 3, in which the group containing an aromatic ring is a phenyl group.

5. The water-developable flexographic printing original plate according to claim 3, in which an amino group equivalent in the silicone compound is 500 to 10,000 g/mol and an equivalent of the group containing an aromatic ring in the silicone compound is 20 to 1,000 g/mol.

6. The water-developable flexographic printing original plate according to claim 1, in which a number average molecular weight of the silicone compound is 500 to 50,000.

7. The water-developable flexographic printing original plate according to claim 1, in which a content of the silicone compound in the photosensitive resin layer is 0.1% to 10% by mass.

* * * * *